United States Patent
Szapucki et al.

(10) Patent No.: US 6,170,432 B1
(45) Date of Patent: Jan. 9, 2001

(54) SHOWERHEAD ELECTRODE ASSEMBLY FOR PLASMA PROCESSING

(75) Inventors: Matthew Peter Szapucki, Toms River; Richard Kulkaski, Forked River; Trevor J. Hadley, Brick; Mark Anthony Santorelli, Barnegat, all of NJ (US)

(73) Assignee: M.E.C. Technology, Inc., Toms River, NJ (US)

( * ) Notice: Under 35 U.S.C. 154(b), the term of this patent shall be extended for 0 days.

(21) Appl. No.: 09/490,443

(22) Filed: Jan. 24, 2000

(51) Int. Cl.$^7$ .............................. C23C 16/00; H05H 1/00
(52) U.S. Cl. ........................ 118/723 E; 156/345
(58) Field of Search .............. 156/345; 118/723 E, 118/715, 723 R, 728, 500, 503, 726

(56) References Cited

U.S. PATENT DOCUMENTS

| | | |
|---|---|---|
| 4,547,247 | 10/1985 | Warenback et al. |
| 4,585,920 | 4/1986 | Hoog et al. |
| 4,612,077 | 9/1986 | Tracy et al. |
| 5,074,456 | 12/1991 | Degner et al. |
| 5,262,029 | 11/1993 | Erkine et al. |
| 5,472,565 | 12/1995 | Mundt et al. |
| 5,569,356 | 10/1996 | Lenz et al. |
| 5,597,439 | 1/1997 | Salzman |
| 5,667,631 | 9/1997 | Holland et al. |
| 5,778,713 | 7/1998 | Butler et al. ............. 72/53 |
| 5,846,332 | 12/1998 | Zhao et al. ............. 118/728 |
| 5,882,411 | 3/1999 | Zhao et al. ............. 118/715 |
| 6,050,216 | * 4/2000 | Szapucki et al. ......... 118/723 E |

* cited by examiner

Primary Examiner—Gregory Mills
Assistant Examiner—P. Hassanzadeh
(74) Attorney, Agent, or Firm—Kenneth Watov; Watov & Kipnes, P.C.

(57) ABSTRACT

A showerhead electrode assembly for a plasma reactor for processing semiconductor wafers includes a gas plate having a plurality of through holes for passage of gas. The top face or side of the gas plate is of smaller diameter than the bottom side or face of the gas plate. An acutely angled peripheral groove is formed between the top face of the gas plate, and the lower portion thereof, with the groove terminating at a band-like ledge with the top face and lower portion. A locking ring is provided by two identical semicircular sections, each of which include in a lower portion of an inside sidewall, respectively, an acutely angled peripheral groove for mating with the groove of the gas plate. A unitary circular support collar is formed with a circular channel in a bottom portion thereof. These components are joined together by applying an adhesive in the channel of the support collar, mounting the locking ring sections onto the gas plate with the grooves therebetween interlocking, and thereafter forcing the channel of the support collar onto the locking ring sections until the bottom surfaces of the support collar abut against the ledge, and top face or side portion of the gas plate, respectively.

16 Claims, 9 Drawing Sheets

SHOWERHEAD ELECTRODE ASSEMBLY FOR PLASMA PROCESSING

RELATED APPLICATION

This Application is related to co-pending application Ser. No. 09/137,982 entitled "SHOWERHEAD ELECTRODE ASSEMBLY FOR PLASMA PROCESSING", filed on Aug. 21, 1998, and to Application (now U.S. Pat. No. 6,050,216, issued Apr. 18, 2000) Ser. No. 09/490,444 entitled "SHOWERHEAD ELECTRODE ASSEMBLY FOR PLASMA PROCESSING," filed Jan. 24, 2000.

FIELD OF THE INVENTION

The present invention relates generally to an apparatus used in the processing of semiconductor wafers in plasma reactors, and more particularly to a composite electrode wherein a gas plate with locking rings is clamped within a unitary collar providing enhanced ease of assembly and disassembly.

BACKGROUND OF THE INVENTION

Plasmas are used for many processes to alter the surface of a material, such as an integrated circuit chip wafer, in a controlled manner. Typical applications include the etching of semiconductor wafers, ion implantation, ion milling, and the removal of material in a process known as reactive ion etching. The fabrication of an integrated circuit usually begins with a thin, polished slice of a high purity, single-crystal semiconductor material, such as silicon, or germanium, which is subjected to a sequence of processing steps, such as deposition of materials on the wafer, or removing materials from the wafer to form the structured layers of the integrated circuit. Early etching techniques were based on chemical etching agents. Early deposition processes included sputtering or chemical vapor deposition techniques. More recently, etching and deposition processes based on energetic plasma ions taking place in a plasma reactor, have been replacing the earlier techniques because of environmental and health concerns, in addition to the improved quality which results from the plasma process.

Plasma reactors typically include a chamber in which the plasma is established, a source of gas which is ionized to form the plasma, a source of energy to ionize the gas, a vacuum system to reduce the pressure within the chamber to the appropriate level for the particular process, and a means for allowing the gas to enter the chamber in a controlled manner.

Generally, the item to be processed, which may typically be a semiconductor wafer with appropriate masking, is placed within the chamber and is electrically biased relative to the gas in order to induce the charged species of the ionized gas to impinge on the wafer preferably substantially normal to the surface. In some cases, chemically reactive gases are also used to enhance the rate of etching in a process called reactive ion etching.

In a typical plasma etching system, the chamber has an upper electrode which serves as an anode, and a lower electrode which serves as a cathode. The item to be processed is generally mounted on the cathode. In such a system, the cathode is biased negatively with respect to the anode and the chamber walls, and thereby establishes an electric field between to the cathode and the surrounding region. The electric field gradient established by the negatively biased cathode is sufficiently strong enough to dissociate the particular gas used in the chamber, at the operating pressure to form a plasma. The dissociated gas results in charged particles in the form of electrons and positively charged ions, each of which are accelerated by the electric field. The surface of the item to be processed is etched by the positive ions that are accelerated towards the negatively charged cathode by the electric field. It is generally important in semiconductor processing that the ions strike the wafer with a uniform flux density so that all parts of the wafer are processed at the same rate, and that the ions follow a path that is perpendicular to the surface of the wafer in order to prevent defects associated with undesirable etching of the sides of the semiconductor structures. It is also important that extraneous particles which can cause defects be eliminated, and that the components of the reactor be easily replaced or serviced.

Generally the upper electrode, the anode, is provided with gas holes in a distribution that encourages an even distribution, and uniform flow, of plasma over the surface of the article to be processed. Typically, the anode is comprised of a silicon disk of uniform thickness, and is referred to as a showerhead electrode in the art. When gases which are chemically reactive with the material to be etched, are used in the process known as reactive ion etching, the energetic etching properties of the plasma process are combined with the chemical etching effect of the reactive gas. Reactive gases typically contain compounds of highly reactive elements, such as chlorine, bromine or fluorine, generally in a mixture with other gases such as oxygen, neon, argon, or sulphur. Other compounds, using other chemicals are also well known in the art.

One consequence of using reactive gases is that the reactive gases cause excessive electrode wear. Also, the electrons which are created by the dissociated gas are accelerated towards the anode, and cause etching and wear. A detrimental effect of the anode wear, is that the holes which form the gas inlet may change over time, and effect the process.

In certain known showerhead configurations, the silicon gas plate is secured to the graphite ring using Indium which is known to bond silicon to graphite. However, there are a number of disadvantages with using Indium in the plasma reactor. There is evidence that Indium has a low level of toxicity and thus has handling and disposal problems. Indium is relatively expensive. Indium also has a high vapor pressure, which means that it easily outgases, which in the plasma reactor chamber vacuum, causes outgassing of particulates, which contributes to creating a dirty chamber. The process for soldering the silicon gas plate to the graphite ring with Indium is difficult, because a flux cannot be used. The assembly process requires heating the silicon and graphite to drive off impurities, and then rubbing the silicon and graphite with pure Indium to produce oxides. The Indium solder then bonds to the Oxides, which is bonded to the silicon and graphite parts. The resulting solder bond is in mechanical stress, and being a relatively soft material, tends to flow since it is in a state of shear. Another disadvantage with the use of an Indium bond, is that it is the only structural support holding the silicon gas plate to the graphite ring, and if the temperature of the gas plate and ring approaches 150° C., such as may happen if the plasma process runs hot, the gas plate may fall, damaging the wafer or the reactor. Finally, the Indium solder bond is thermally cycled during the manufacturing process, which could weaken the oxide bonds, also causing a failure.

Consequently, it is desirable to have an anode showerhead assembly that is structurally reliable, and is easy to assemble and disassemble. Also, it is desirable to have a showerhead assembly which is made of materials which are compatible with the plasma and reactive etching processes in the reactor. It is also desirable to have a showerhead assembly in which the hole pattern can be changed to accommodate the process, when gas mixture, flow rate, wafer size and pressure is changed to accommodate each particular process.

SUMMARY OF THE INVENTION

It is an object of this invention to provide an improved plasma reactor showerhead electrode assembly comprised of a disk shaped gas plate, that has a number of gas passage holes distributed axisymmetrically through from one side of the disk to the other, in order to allow the passage of gas through the gas plate in a uniform and controlled manner. Typically the gas plate is made from silicon, but graphite, aluminum or any suitable material may be used. The gas plate is formed with an upper portion of smaller outside diameter than an underlying lower portion. In a preferred embodiment of the invention, the exposed face of the upper portion provides a first side of the gas plate which typically faces the plasma and the exposed face of the lower portion provides a second side of the gas plate which typically faces the gas source. A circular band-like ledge is formed between the upper and lower portions, with an acutely angled groove being formed between the outer peripheral edge of the first side and the ledge.

A locking ring consists of two semicircular sections typically of purified graphite material. Each section includes an acutely angled peripheral groove formed around a lower portion of an inner sidewall for mating with the peripheral groove of the gas plate, with the bottom of the associated section abutting against the ledge of the gas plate. An outer sidewall of each section tapers inward proceeding from the bottom to the top of the section.

An antirotation mechanism is provided to prevent the gas plate section from rotating within the locking ring sections. The mechanism comprises of a protrusion machined into the gas plate which is held between a gap in the locking ring sections after assembly.

A unitary circular collar, typically of purified graphite material, is formed with a circular channel extending into its bottom portion. The channel is configured for mating with the locking rings and gas plate to secure the same together, as described below.

The showerhead electrode is assembled by first placing the two locking ring sections on the gas plate with the interlocking grooves between the locking ring sections and the gas plate loosely engaged. An appropriate adhesive is applied into the channel of the support collar. Next, the upper portions of the lock ring sections are installed into the channel of the support collar, and forced together under pressure for locking the components together. The channel of the support collar has an outer inside sidewall that slopes inward or converges proceeding from the opening of the channel to the bottom of the channel. The combination of the sloping inside outer wall of the channel and the sloping or tapered outer sidewalls of the locking ring sections forces the gas plate, locking ring, and support collar into a tighter fit than would otherwise be obtained.

BRIEF DESCRIPTION OF THE DRAWINGS

The various embodiments of the invention are described in detail below with reference to the drawings, in which like items are identified by the same reference designations, wherein.

DETAILED DESCRIPTION OF THE INVENTION

Figure 1:
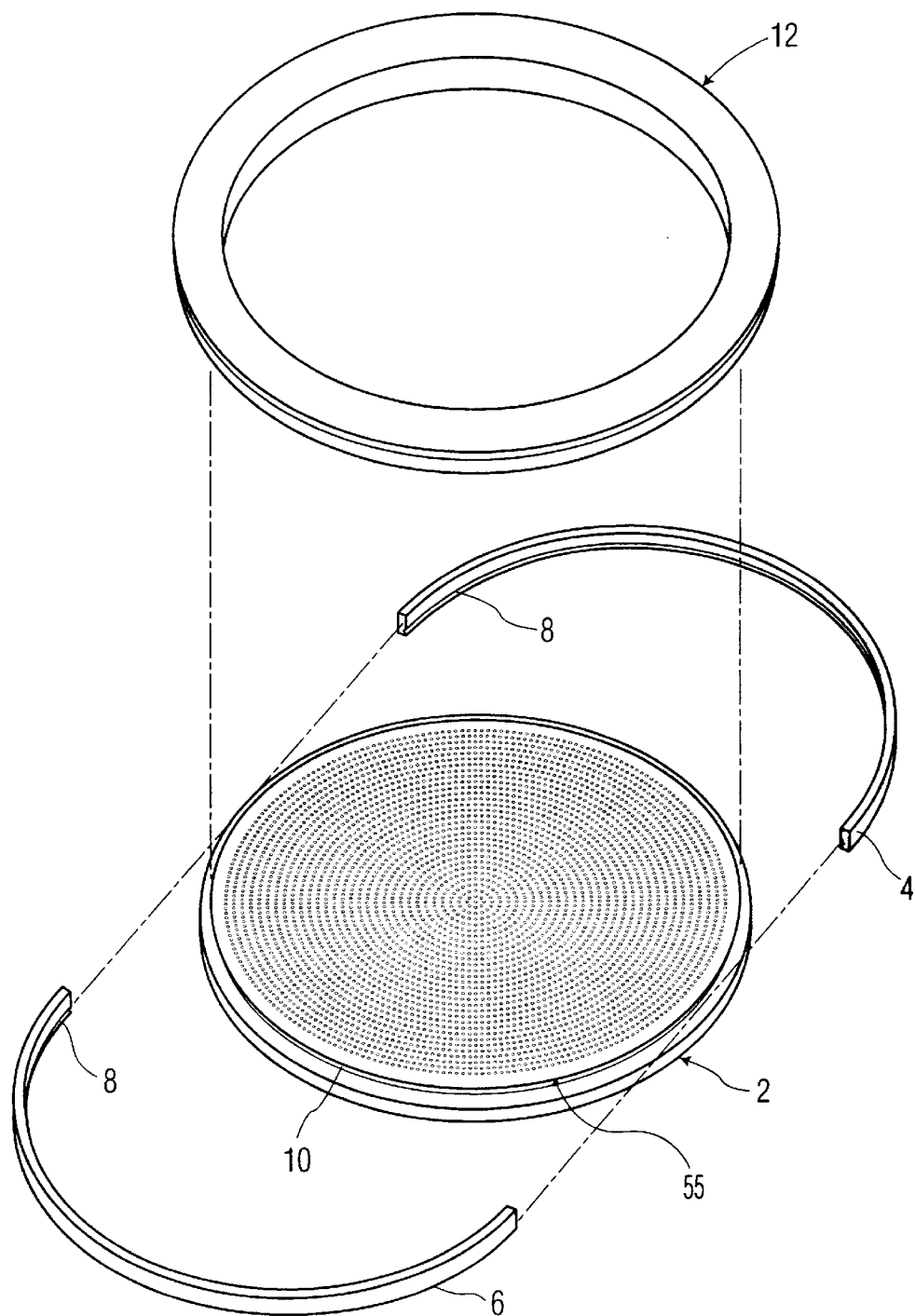
FIG. 1 is an exploded top assembly view of one embodiment of the showerhead electrode assembly, shown with the lock ring assembly separated into its two semicircular parts ready for mounting on a gas plate, the support collar being positioned for installation thereon.
Figure 8:
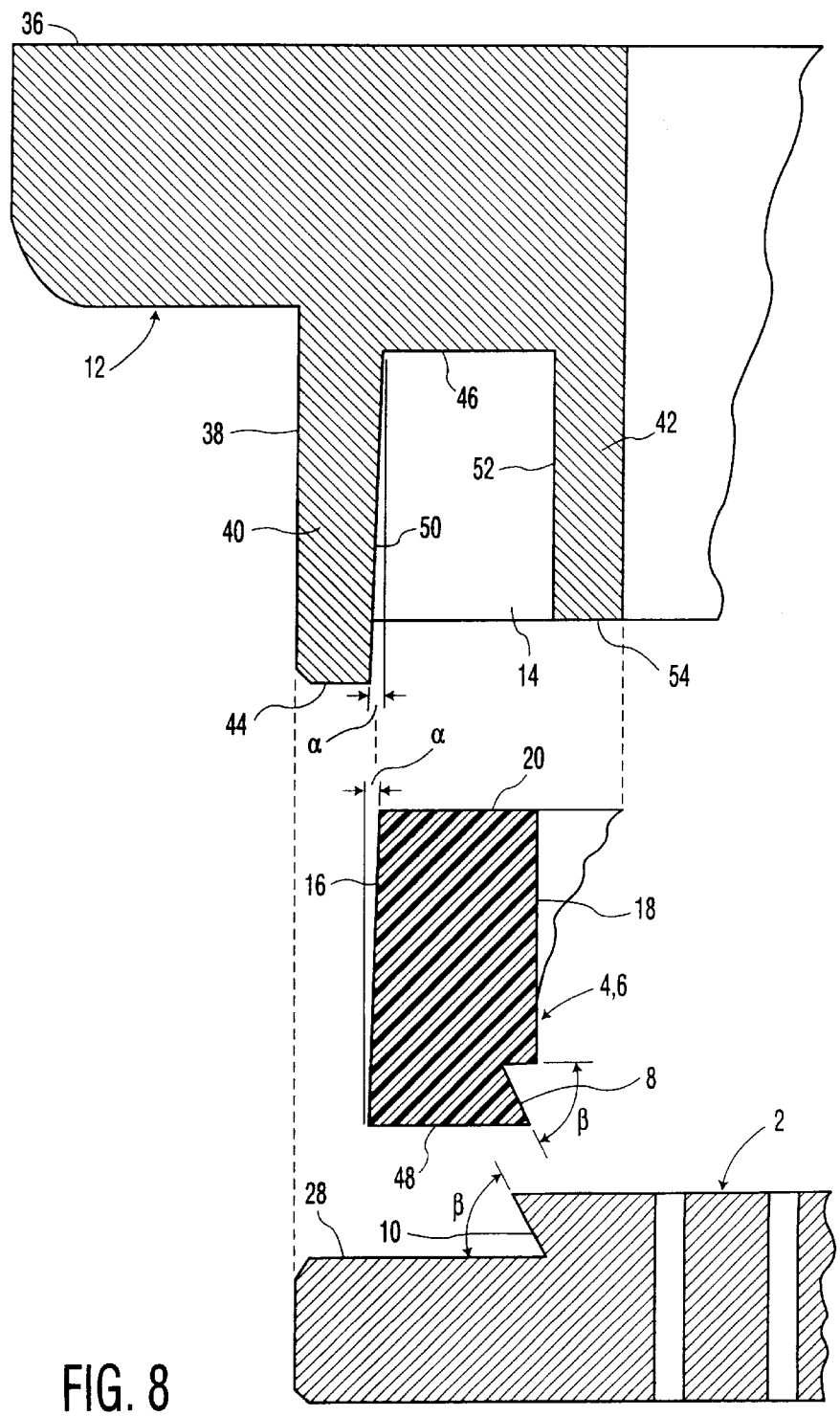
FIG. 8 is an exploded assembly and detail view of FIG. 7.

With reference to FIG. 1, an exploded top assembly view of the showerhead electrode assembly of one embodiment of the invention is shown. As shown, a gas plate 2 is positioned to receive two semicircular sections 4,6 of a lock ring, respectively. Each locking ring section 4,6, includes an acutely angled groove 8, respectively, for mating with a peripheral groove 10 of gas plate 2. With reference also to FIG. 8, the locking ring sections 4,6 installed on the gas plate 2, a support collar 12 includes a channel 14 for mating with an outside sidewall 16, inside sidewall 18, and top portion 20 of the locking ring sections 4,6, respectively. In this manner, the support collar 12 securely locks together the gas plate 2, and locking ring sections 4,6, as will be described in greater detail below.

Figure 2:
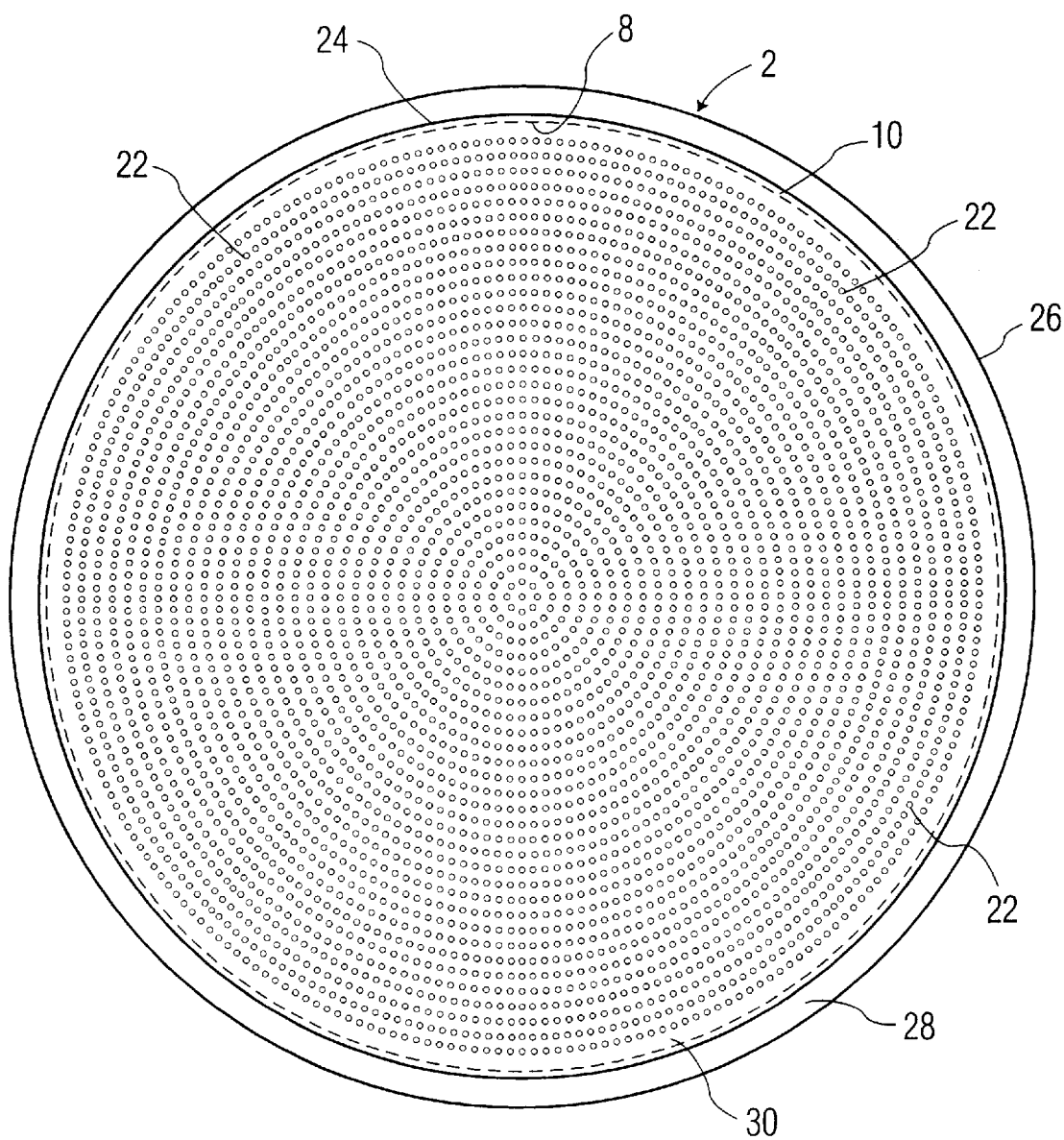
FIG. 2 is a top view of a gas plate showing its grooved side for one embodiment of the invention.
Figure 3:
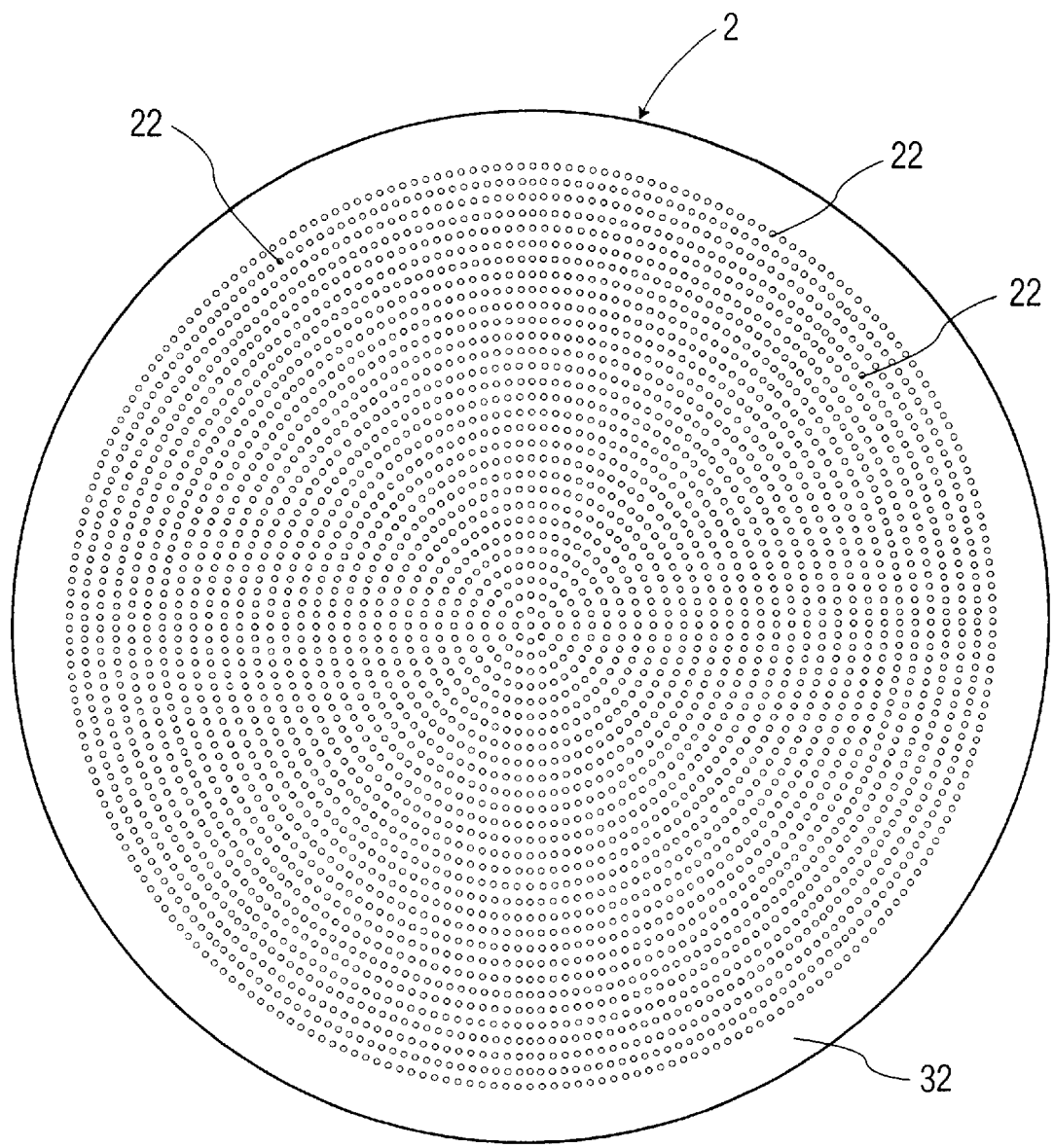
FIG. 3 is a bottom view of the gas plate of FIG. 2.
Figure 4:
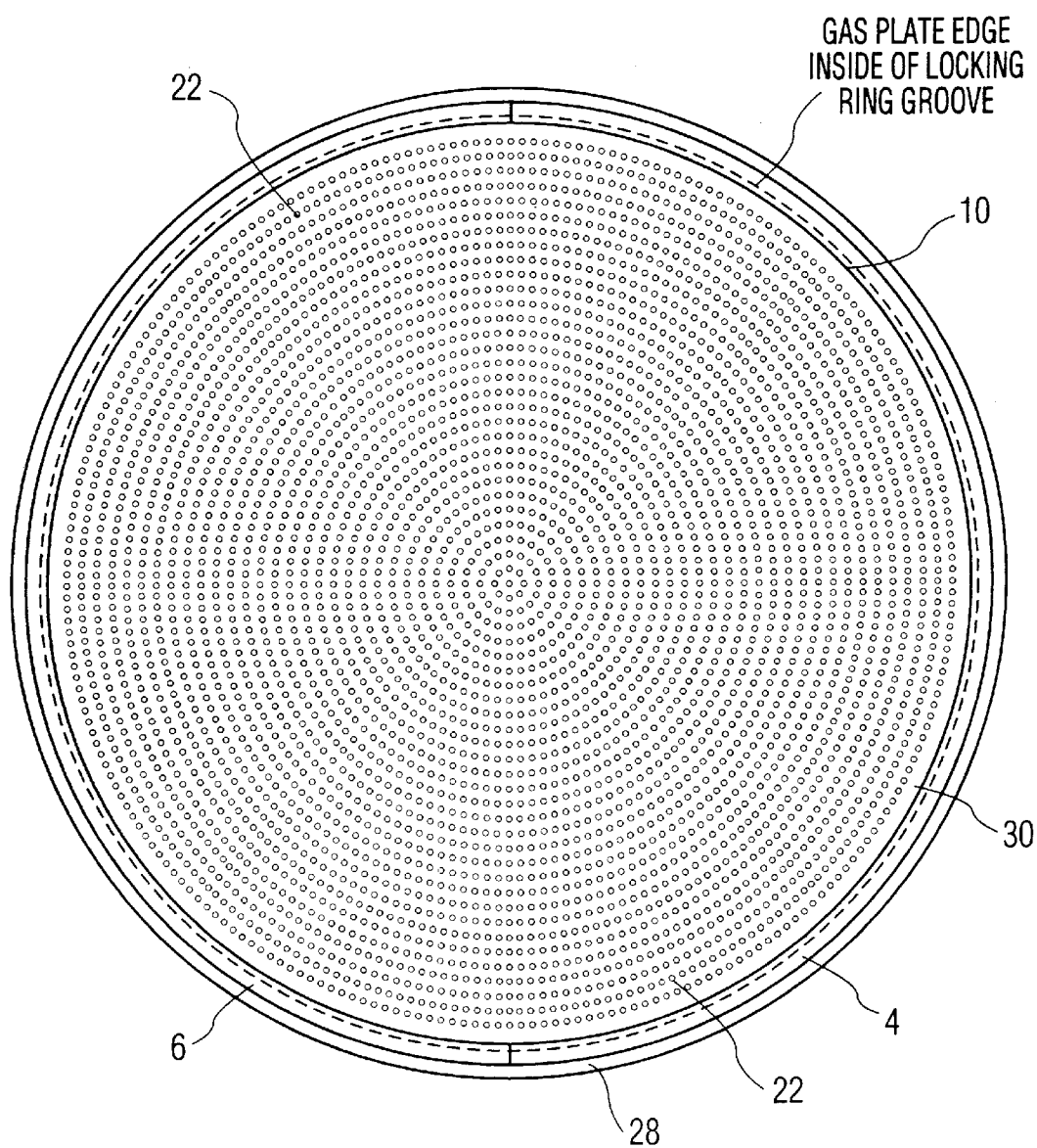
FIG. 4 illustrates a top view of the gas plate with the locking ring installed thereon.
Figure 5:
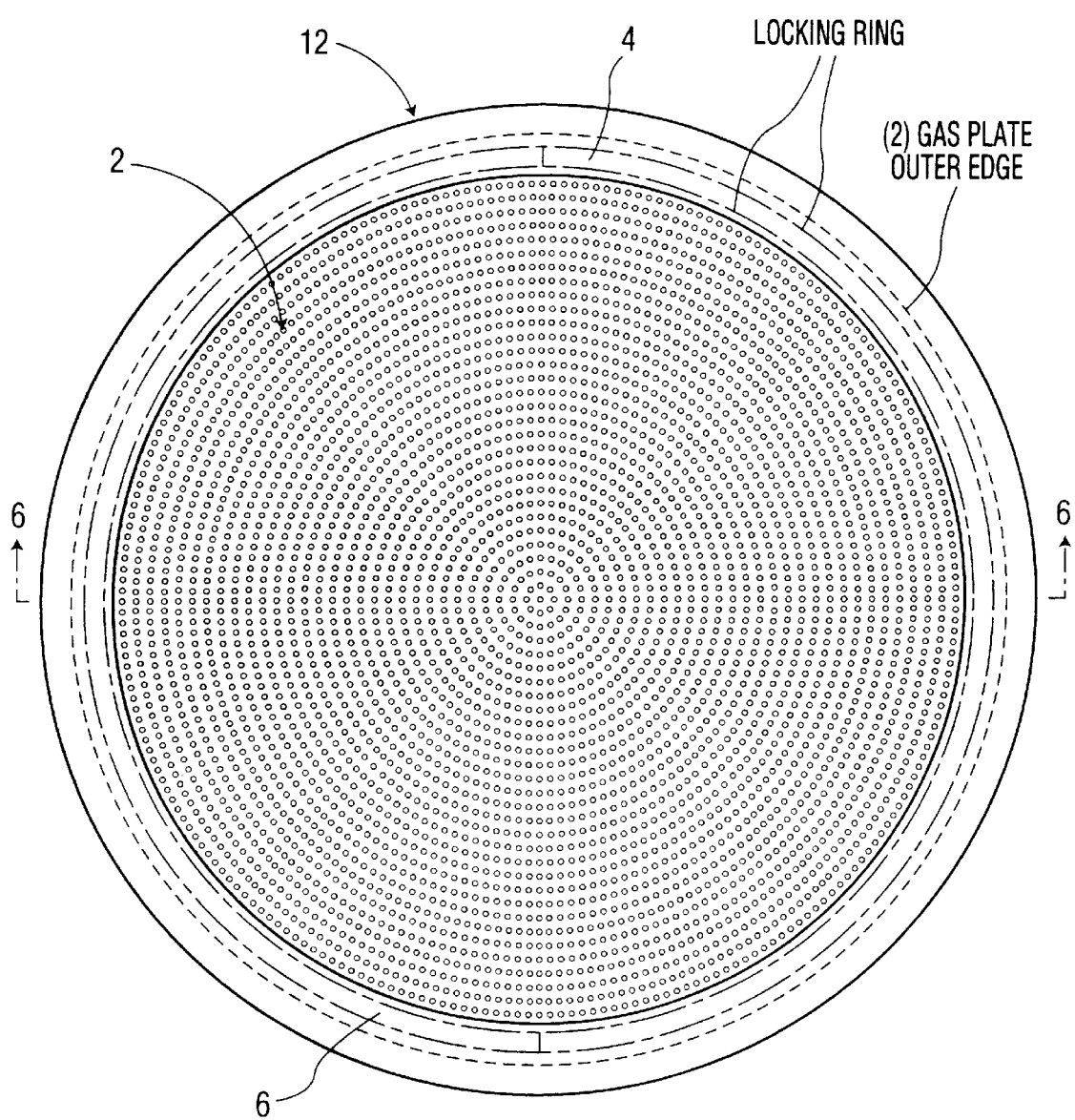
FIG. 5 shows a top view of the fully assembled showerhead electrode with the locking ring and support collar locked together on the gas plate for one embodiment of the invention.

As shown in FIG. 2, for a top view of gas plate 2, it includes a plurality of through holes 22 for the passage of gas therethrough. In the example shown, the through holes 22 are arranged in a plurality of concentric circles on gas plate 2. However, the pattern of holes 22 can be any desired pattern, and the example shown is not meant to be limiting. As shown in the top view, the upper portion 24 of the gas plate 2 is smaller in diameter than the lower portion 26, whereby a band-like ledge 28 is formed therebetween. The face of the upper portion 24 provides a first side 30 of the gas plate 2. The bottom of the gas plate 2, as shown in FIG. 3, has a face which provides a second side 32 of gas plate 2. In this example, the opposing first and second sides 30,32, respectively, have substantially flat surfaces which are parallel to each other. This is clearly shown in the cross sectional view taken along 6—6 of FIG. 5, as shown in FIG. 6.

Figure 6:
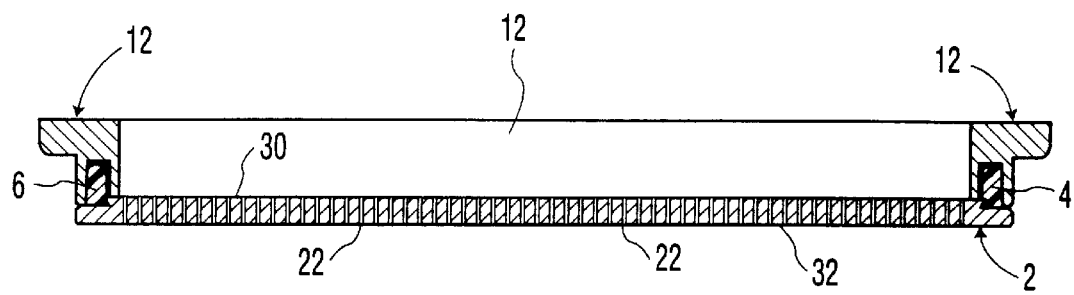
FIG. 6 is a cross-sectional view of the showerhead electrode assembly taken along 6—6 of FIG. 5.
Figure 7:
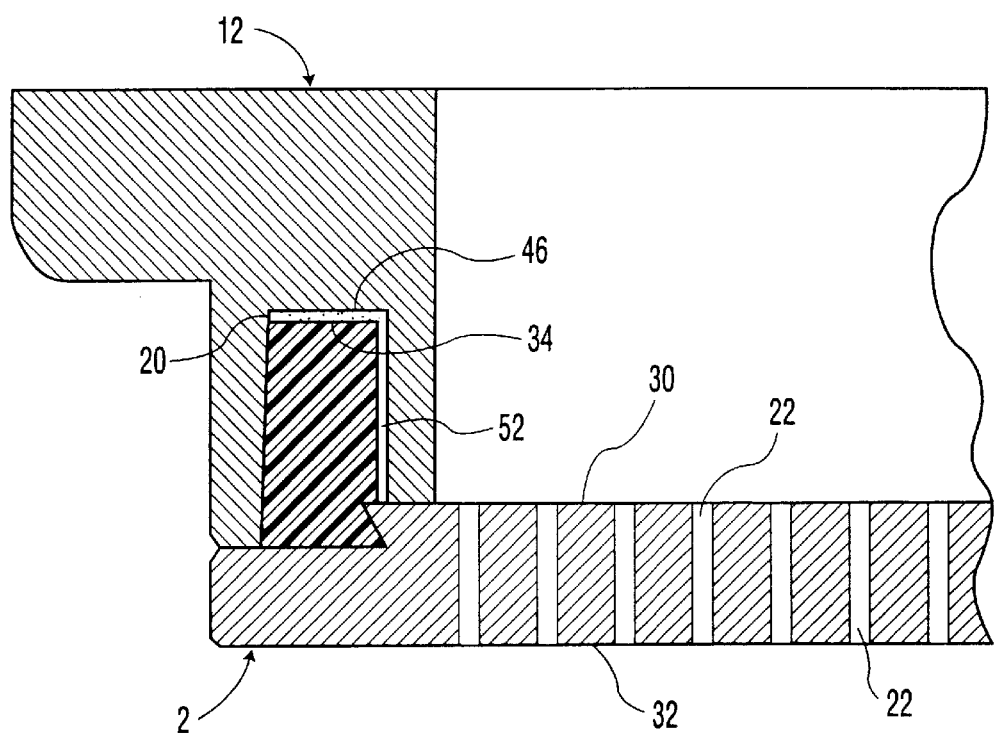
FIG. 7 is a detail view of an end portion of the cross section of FIG. 6 showing the mating of the support collar with a locking ring semicircular section and the gas plate.

As shown in FIG. 7, providing a detailed view of an end portion of the cross section of FIG. 6, the assembled showerhead electrode includes an appropriate adhesive 34, such as graphite bond, for example, for securing the support collar 12 to the locking ring sections 4,6, respectively.

In the exploded assembly diagram of FIG. 8, for the detail view of FIG. 7, the support collar 12 includes a top portion 36 that is greater in diameter than the diameter of the second side 32 of the gas plate 2, which is the maximum diameter of the latter. A lower portion 38 of support collar 12 has an outside diameter that is about the same as the diameter of the second side 32 of gas plate 32 (see FIG. 6). Also note that the channel 14 if formed between an outer cylindrical wall portion 40, and an inner cylindrical wall portion 42 of the lower portion 38. Note further that the outer cylindrical wall portion 40 is longer than, and extends below the bottom of the inner cylindrical wall portion 42 of support collar 12. This insures that when the showerhead electrode assembly is fully assembled, the bottom of the outer cylindrical wall portion 40 will abut against the ledge 28 of gas plate 2, and the bottom of the inner cylindrical wall portion 42 will abut against the surface of the first side 30 of gas plate 2 (see FIG. 7), thereby insuring the rigidity and stability of the assembly and allow for the flow of RF power.

With further reference to FIG. 8, in the preferred embodiment of the invention, the inside face or sidewall of the outer wall 40 tapers inward or converges from the bottom 44 of wall 40 to the bottom 46 of channel 14, at an angle $\alpha$ of one degree (1°), in this example. Also, as shown, the outside side wall 16 of each of the locking ring sections 4,6, respectively, tapers outward or diverges proceeding from the top portion 20 thereof to the bottom portion 48 thereof, also at an angle $\alpha$. As indicated, in the preferred embodiment, $\alpha$ is 1°. The acutely angled groove 8 of each of the identical locking ring sections 4,6, is formed with an angle $\beta$. Note further that the groove 10 of gas plate 2 also is formed with an angle $\beta$. In a preferred embodiment of the invention, $\beta$ is about 60°, for example. By providing the indicated sloping of the inside sidewall 50 of cylindrical wall 40 of support collar 12, and the sloping sidewall 16 of the locking ring sections 4,6, when these components are secured together with the gas plate 2, the aforesaid sloping sides force the locking ring sections 4,6 into a tighter more secure engagement with the gas plate 2 and support collar 12, than would otherwise be provided without use of the sloping sides.

The preferred assembly of the aforesaid components for the showerhead electrode assembly involves four steps. In the first step, the locking ring sections 4,6, respectively, are installed onto the ledge 28 of the gas plate 2, with the grooves 8 of locking ring sections 4,6, engaging the groove 10 of the gas plate 2. The second step involves applying an adhesive 34 (see FIG. 7) in the bottom 46 of the channel 14 in the support collar 12. After assembly, the adhesive 34 is precisely confined to an area between the top portion 20 of the locking ring section 4, 6 and the bottom 46 of the channel 14. In the third step, channel 14 of the support collar 12 is pushed onto the protruding upper portions of the locking ring sections 4,6, respectively. In the fourth step, the support collar 12 is forced under pressure to fully engage the locking ring sections 4,6, respectively, into the channel 14, with the bottom of 44 of the outer cylindrical wall 40 of support collar 12 seated upon ledge 28, and the bottom 54 of the inner cylindrical wall 42 of support collar 12 seated or resting upon the surface of the first side 30 of gas plate 2, as shown in FIG. 7. Thereafter, the adhesive 34 is allowed time to cure, whereafter the showerhead assembly is ready for use.

Figure 1A:
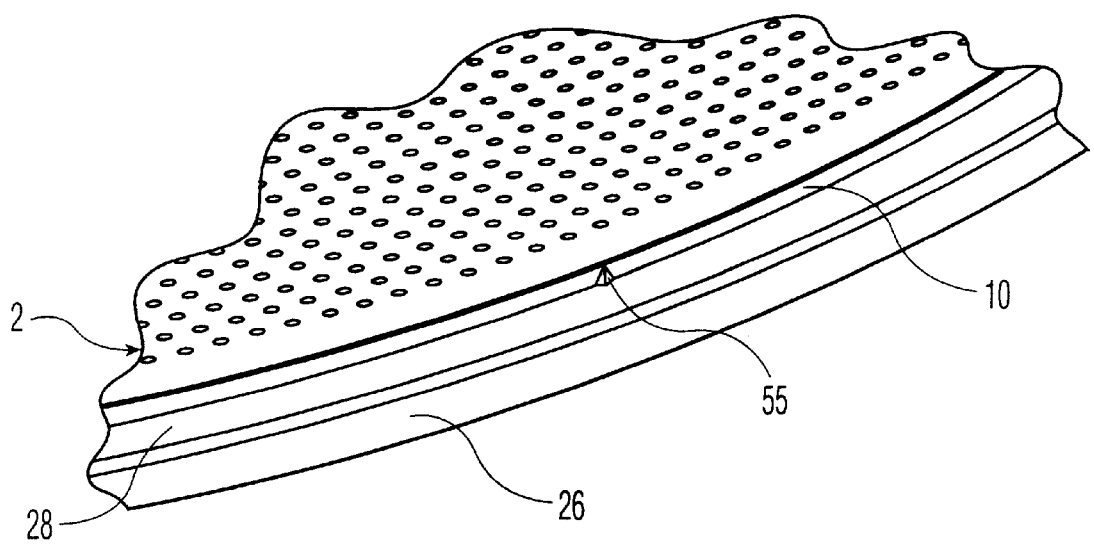
FIG. 1A is an enlarged view of the gas plate showing a machined lip or protrusion on a peripheral groove thereof.

In the preferred embodiment, it is desirable to prevent rotational movement of the gas plate 2 with the locking ring sections 4,6, respectively. The anti-rotational mechanism is provided by a machined lip 55 on the peripheral groove 10 of the gas plate 2 as shown in FIGS. 1 and 1A. When the locking ring sections 4 and 6 are mated to the perpheral groove 10, the ends of the locking ring sections 4 and 6 meet at the machined lip 55. Once the support collar 12 is pushed onto the locking ring sections 4 and 6 of the gas plate 2 cannot rotate within the assembly.

Typical materials for the components of the present showerhead electrode assembly will now be discussed, for the preferred embodiment of the invention. The gas plate 2 material is single crystal silicon, having a crystal orientation of 1-0-0, with the carrier type being P-type Boron Dopant. The resistivity is 10 to 20 ohms per centimeter. The purity of the single crystal silicon material is 99.9%. Typically the upper portion of the gas plate, that is the portion of smaller diameter formed between the first side 30 and the ledge 28, is 0.075 inch thick, whereas the remaining lower portion is 0.175 inch thick. The diameter of the second side 32 of gas plate 2 is about 8.8 inches, whereas the diameter of the first side 30 is about 8.284 inches.

The locking ring sections 4,6 are substantially identical, and the material of each is preferred to be purified graphite, having impurities of less than 2 PPM (parts per million). The radius of each lock ring 4,6 to its outermost sidewall 16 is about 4.3 inches, whereas the radius to the inner most point of each associated groove 8 is about 4.1 inches. The maximum width or thickness of each locking ring section 4,6 is about 0.4 inch, and the groove 8 has a width of about 0.08 inch.

The support collar 12 material is purified graphite, having impurities of less than 2 PPM. The maximum diameter of the support collar 12 is about 9.52 inches and the minimum diameter about 8.006 inches. Note that the preferred dimensions and materials for each component are given herein for purposes of example only, and are not meant to be limiting. The dimensions and materials may be changed in accordance with particular applications without departing from the spirit and scope of the present invention.

Figure 9:
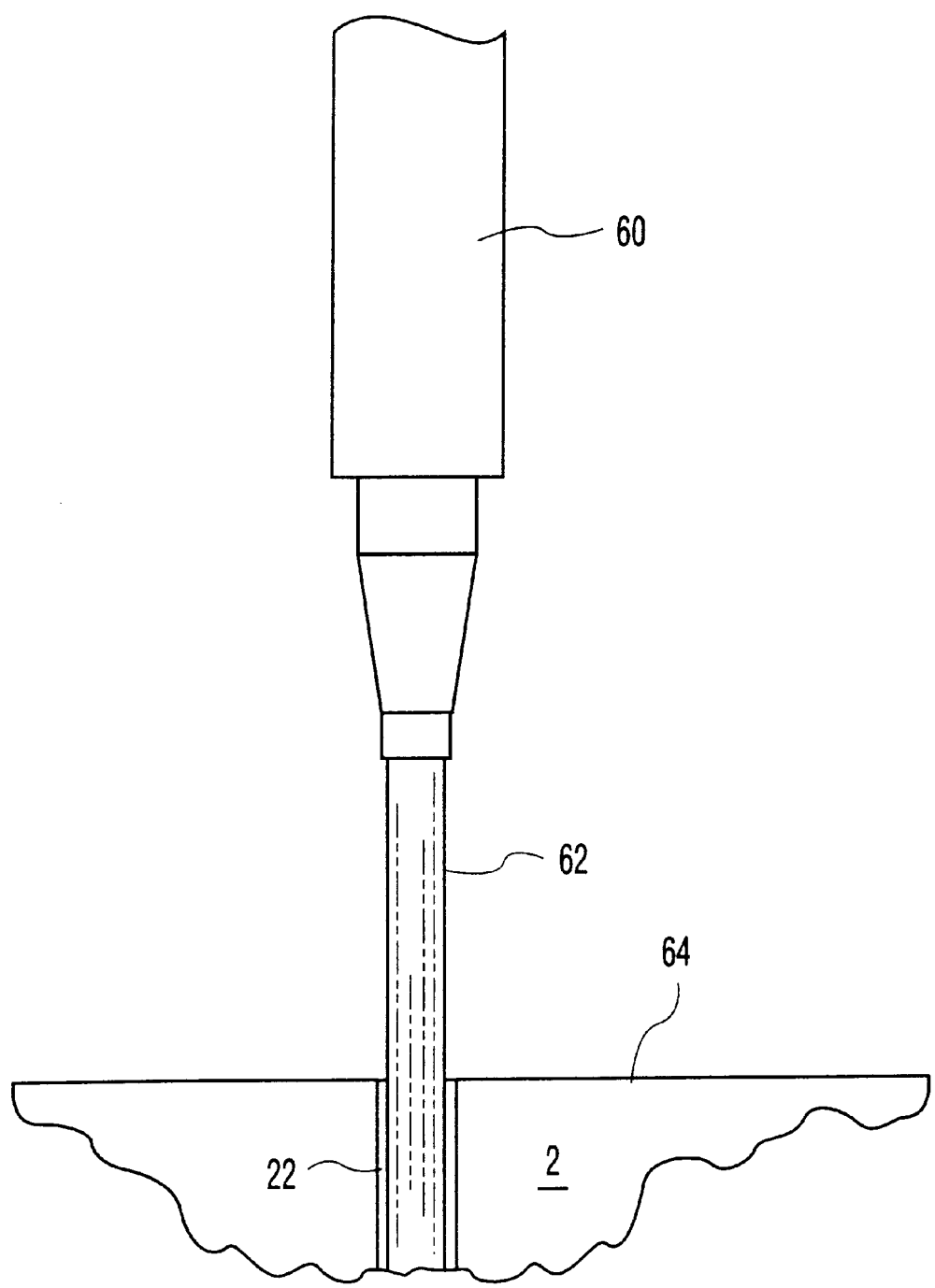
FIG. 9 is a detail view of a nozzle of a ultrahigh velocity water jet apparatus boring one of a plurality of through holes in the gas plate with a continuous stream of pressurized water.

As to forming the array of through holes 22 in the gas plate 2, the through holes 22 may be formed by a number of different suitable means available in the art, such as rotary drilling, ultrasonic drilling and the like. More preferably, the array of through holes 22 is formed using ultrahigh velocity water jet means as illustrated in FIG. 9. This method of boring through holes 22 through the gas plate 2 is achieved by precisely focusing a ultrahigh velocity stream of water 62 ejected from an ultrahigh velocity water jet apparatus 60 on a surface 64 of the gas plate 2. During the process, the ultrahigh velocity stream of water 62 continuously impacts the surface 64 of the gas plate 2 until the through hole 22 is formed. A suitable ultrahigh velocity water jet method and apparatus for peening is disclosed and taught in U.S. Pat. No. 5,778,713 to Butler et al., wherein the teachings thereof are incorporated herein by reference in their entirety. Though Butler et al. limits the use of the ultrahigh velocity water jet apparatus for peening the surface of a ductile work piece, Applicants have adapted and extended its application for boring or cutting through holes in a substrate such as the gas plate 2 which is composed of silicon, a brittle material.

The ultrahigh velocity water jet apparatus 60 provides improved hole alignment and exceptional boring tolerances in comparison to other methods of boring holes in a substrate. For example, the tolerance characteristic of ultrasonic drilling is about +/−0.008" while the tolerance characteristic of the ultrahigh velocity water jet apparatus 60 is about +/−0.004", a substantial improvement. These advantages produce more concentric holes with exceptionally smooth surfaces therein and a substantially improved uniformity in the array of through holes 22 relative to other boring methods. The smooth surface of the through holes 22 improves the operating performance and life of the gas plate 2 by allowing the plasma ions to flow more efficiently therethrough. The uniformity of the array of through holes 22 formed by this water jet means improves the uniform flux density of the ions in the plasma striking the wafer during semiconductor processing and produces a more uniform and focused flow of the ions, thereby minimizing stray or errant discharge of plasma ion on the wafer.

Additionally, the ultrahigh velocity water jet apparatus 60 also reduces the degree of breakout in the bored gas plate 2 relative to other known boring methods. For comparison, the ultrasonic drilling produces a breakout of about 0.0030" while the ultrahigh velocity water jet apparatus 60 produces a substantially reduced breakout of about 0.0015". The term "breakout" describes the residual material that breaks away from the substrate immediately prior to the instant the boring medium reaches the end of the bore to form the through hole 22. The breakout event creates jagged edges and structural imperfections in and around the end of the through hole and the surrounding surfaces. To remove the breakout portions of the gas plate 2, the surface of the bored substrate must be laboriously grounded and polished. The smaller breakout substantially reduces the amount of grinding and polishing required, and the required starting thickness of the unprocessed blank silicon gas plate 2. Consequently, the costs and time associated with the grinding and polishing is lowered substantially for improved overall cost, reduced fabrication time, and more efficient utilization of raw material. The total cost savings resulting from the ultrahigh velocity water jet method is about 30% over the ultrasonic drilling method. Although various embodiments of the invention have been shown and described herein, they are not meant to be limiting. Those of skill in the art may recognize certain modifications to various embodiments of the invention, which modifications are meant to be covered by the spirit and scope of the appended claims.

What is claimed is:

1. A showerhead electrode assembly for a plasma reactor system for processing semiconductor wafers, comprises:

a disk shaped gas plate having an upper portion of smaller diameter than a lower portion, the face of the upper portion providing a first side of said gas plate, the face of the lower portion providing a second side of gas plate, a peripheral acutely angled first groove being formed between said first side and said lower portion, said first groove terminating at a band-like ledge of said lower portion;

a locking ring including identical semicircular first and second sections each having a peripheral acutely angled second groove in a lower portion of respective inside sidewalls thereof, said second grooves being conformed to interlock with and receive said ledge with respective ends abutting, and each further including an upper portion protruding above said ledge and said first side of said gas plate;

a unitary circular support collar having opposing top and bottom portions, said bottom portion being formed with a circular channel extending into a bottom face thereof, forming a circumferential outer bottom surface on one side of said channel, and a circumferential inner bottom surface on the other side of said channel, the outer bottom surface vertically extending beyond the inner bottom surface, said channel being configured to receive the portions of said first and second sections of said locking ring protruding above said ledge and first side of said gas plate;

said support collar having its channel forced onto protruding of said first and second locking ring sections mounted on said ledge, for in turn forcing the second groove of each of said locking ring sections, respectively, to engage and interlock with the first groove of said gas plate, the outer bottom surface of said support collar abutting against said ledge, and the inner bottom surface abutting against the first side of said gas plate; and means for rigidly securing together said first and second sections of said locking ring, and a portion of the channel of said support collar.

2. The showerhead electrode assembly of claim 1, wherein said means for rigidly securing consists of adhesive material.

3. The showerhead electrode assembly of claim 1, further including:

said channel of said support collar including an outer inside sidewall that converges or slopes inward proceeding from the opening of the channel to a bottom of said channel; and said first and second sections of said locking ring each including an outer sidewall that slopes inward or converges proceeding from the bottom to the top of each section, and whereby the sloping sidewalls of said channel and first and second sections of said locking ring, forces said gas plate and locking ring first and second sections into a tighter interlocking fit than would otherwise be provided.

4. The showerhead electrode assembly of claim 3, wherein the slope of the outer inside sidewall of said support collar, and the slopes of said first and second sections of said locking ring are each 1°.

5. The showerhead electrode assembly of claim 1, wherein said gas plate consists of single crystal silicon material.

6. The showerhead electrode assembly of claim 1, wherein said first and second sections of said locking ring each consist of purified graphite material.

7. The showerhead electrode assembly of claim 1, wherein said support collar consists of purified graphite material.

8. The showerhead electrode assembly of claim 1, wherein said gas plate further includes a plurality of through holes between its first and second sides for the passing of gas, said plurality of through holes being arranged in a desired pattern.

9. The showerhead electrode assembly of claim 1, wherein said gas plate further includes a plurality of through holes between its first and second sides for the passing of gas, said plurality of through holes being formed therethrough by an ultrahigh velocity water jet boring apparatus.

10. The showerhead electrode assembly of claim 1, wherein said unitary support collar further includes:

said channel being formed between an outer cylindrical wall and an inner cylindrical wall in a lower portion of said support collar;

said outer cylindrical wall having a bottom surface extending beyond a bottom surface of said inner cylindrical wall, whereby when said electrode assembly is assembled, the bottom surface of said outer cylindrical wall abuts against said ledge of said gas plate, and the bottom surface of said inner cylindrical wall abuts against said first side of said gas plate.

11. The showerhead electrode assembly of claim 10, wherein said support collar further includes an upper portion of greater outside diameter than that of said lower portion thereof.

12. The showerhead electrode assembly of claim 11, wherein said upper portion of said support collar has a greater outside diameter than the diameter of the lower portion of said gas plate.

13. The showerhead electrode assembly of claim 12, wherein the grooves of said gas plate, and said first and second sections of said locking ring each have an interior angle of 60°.

14. The showerhead electrode assembly of claim 1, wherein the grooves of said gas plate, and said first and second sections of said locking ring each have an interior angle of 60°.

15. The showerhead electrode assembly of claim 14, wherein the slope of the outer inside sidewall of said support collar, and the slopes of said first and second sections of said locking ring are each 1°.

16. The showerhead electrode assembly of claim 1, wherein the slope of the outer inside sidewall of said support collar, and the slopes of said first and second sections of said locking ring are each 1°; and the grooves of said gas plate, and said first and second sections of said locking ring each have an interior angle of 60°.

* * * * *